United States Patent
Kwak et al.

(10) Patent No.: US 10,134,484 B2
(45) Date of Patent: Nov. 20, 2018

(54) SEMICONDUCTOR DEVICES, SEMICONDUCTOR SYSTEMS INCLUDING THE SAME, METHODS OF TESTING THE SAME

(71) Applicant: SK hynix Inc., Icheon-si Gyeonggi-do (KR)

(72) Inventors: Myung Kyun Kwak, Yongin-si (KR); Bok Rim Ko, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 291 days.

(21) Appl. No.: 14/808,417

(22) Filed: Jul. 24, 2015

(65) Prior Publication Data

US 2016/0291082 A1 Oct. 6, 2016

(30) Foreign Application Priority Data

Mar. 31, 2015 (KR) .................. 10-2015-0045752

(51) Int. Cl.
*G11C 29/46* (2006.01)
*G11C 29/00* (2006.01)
*G11C 29/12* (2006.01)
*G01R 31/317* (2006.01)

(52) U.S. Cl.
CPC ........ *G11C 29/46* (2013.01); *G01R 31/31701* (2013.01); *G11C 29/006* (2013.01); *G11C 29/12* (2013.01); *G11C 29/12015* (2013.01)

(58) Field of Classification Search
CPC ....... G11C 29/006; G11C 29/12; G11C 29/46; G01R 31/31701
See application file for complete search history.

(56) References Cited

U.S. PATENT DOCUMENTS

| | | | |
|---|---|---|---|
| 6,907,555 B1 * | 6/2005 | Nomura | G11C 29/44 714/719 |
| 7,200,059 B2 * | 4/2007 | Fujioka | G11C 29/10 365/201 |
| 7,212,465 B2 * | 5/2007 | Kang | G11C 7/1051 365/189.12 |
| 2007/0018677 A1 | 1/2007 | Marr | |

FOREIGN PATENT DOCUMENTS

KR 1020140065320 A 5/2014

* cited by examiner

*Primary Examiner* — Vanthu Nguyen
(74) *Attorney, Agent, or Firm* — William Park & Associates Ltd.

(57) ABSTRACT

A semiconductor system includes a controller and a semiconductor device. The controller outputs a burn-in test signal, a clock signal and command/address signals. The semiconductor device enters a first test mode if the burn-in test signal is inputted. The semiconductor device enters a second test mode according to a level combination of the command/address signals in synchronization with the clock signal after the semiconductor device enters the first test mode. The semiconductor device enters a third test mode according to an other level combination of the command/address signals in synchronization with the clock signal after the semiconductor device enters the second test mode.

20 Claims, 6 Drawing Sheets

|  | WBI | CA<4> | CA<3> | CA<2> | CA<1> |
|---|---|---|---|---|---|
| FIRST TEST MODE START | H | L | L | L | L |
| SECOND TEST MODE START | H | H | L | L | L |
| THIRD TEST MODE START | H | H | H | L | L |
| THIRD TEST MODE END | H | H | H | H | L |
| SECOND TEST MODE END | H | H | H | H | H |
| FIRST TEST MODE END | L | L | L | L | L |

FIG. 6

SEMICONDUCTOR DEVICES, SEMICONDUCTOR SYSTEMS INCLUDING THE SAME, METHODS OF TESTING THE SAME

CROSS-REFERENCE TO RELATED APPLICATIONS

The present application claims priority under 35 U.S.C 119(a) to Korean Application No. 10-2015-0045752, filed on Mar. 31, 2015, in the Korean Intellectual Property Office, which is incorporated herein by reference in its entirety as set forth in full.

BACKGROUND

1. Technical Field

Embodiments of the invention relate to semiconductor devices, semiconductor systems including the same, and methods of testing the same.

2. Related Art

Semiconductor devices may be designed and fabricated to include a test mode function for evaluating the operation thereof. That is, various parameters of the semiconductor devices may be measured in a test mode at a wafer level or at a package level and the tested semiconductor devices may be sorted into good chips or failed chips according to the test results.

A lot of time may be required to evaluate a lifetime of the semiconductor devices in an actual environment. Thus, it may be very important to reduce a test time for accurately estimating the lifetime of the semiconductor devices. A burn-in test has been widely used to accurately estimate the lifetime of the semiconductor devices.

The burn-in test may be performed by activating word lines of the semiconductor devices, by executing write operations and pre-charge operations of the semiconductor devices at a high temperature (e.g., at a temperature of about 125 degrees Celsius) with a high operation voltage over a normal operation voltage to repeatedly apply stresses to the semiconductor devices, and by executing read operations of the semiconductor devices to discriminate whether memory cells of each of the semiconductor devices normally operate or malfunction. The burn-in test may also be performed to sort out or screen out weak semiconductor devices having a possibility of early failure. That is, the burn-in test may be utilized to provide highly reliable semiconductor devices.

SUMMARY

According to an embodiment, a semiconductor system includes a controller and a semiconductor device. The controller outputs a burn-in test signal, a clock signal and command/address signals. The semiconductor device enters a first test mode if the burn-in test signal is inputted. The semiconductor device enters a second test mode according to a level combination of the command/address signals in synchronization with the clock signal after the semiconductor device enters the first test mode. In addition, the semiconductor device enters a third test mode according to another level combination of the command/address signals in synchronization with the clock signal after the semiconductor device enters the second test mode.

According to an embodiment, a semiconductor device includes a buffer portion, a test controller, and a memory portion. The buffer portion buffers a clock signal to generate an internal clock signal according to a burn-in test signal for activating a first test mode and buffers command/address signals to generate internal command/address signals according to the burn-in test signal. The test controller generates a test enablement signal and a test latch control signal for activating a second test mode according to the burn-in test signal if the internal command/address signals synchronized with the internal clock signal have a first level combination. The test controller also generates internal command signals for activating a third test mode according to the burn-in test signal if the internal command/address signals have a second level combination, and generates test data having a predetermined level combination. The memory portion stores the test data or outputs the test data stored according to the internal command signals according to the test enablement signal.

According to an embodiment, there is provided a method of testing a semiconductor device. The method includes a first step of entering a first test mode according to a burn-in test signal and executing the first test mode according to a clock signal and command/address signals. The method also includes a second step of entering a second test mode if the command/address signals synchronized with the clock signal have a first level combination and executing the second test mode according to the clock signal and the command/address signals. The method also includes a third step of entering a third test mode if the command/address signals synchronized with the clock signal have a second level combination and executing the third test mode according to the clock signal and the command/address signals.

DETAILED DESCRIPTION

Various embodiments of the invention will be described hereinafter with reference to the accompanying figures. However, the embodiments described herein are for illustrative purposes only and are not intended to limit the scope of the invention. Various embodiments are directed to semiconductor devices, semiconductor systems including the same, and methods of testing the same.

Figure 1:
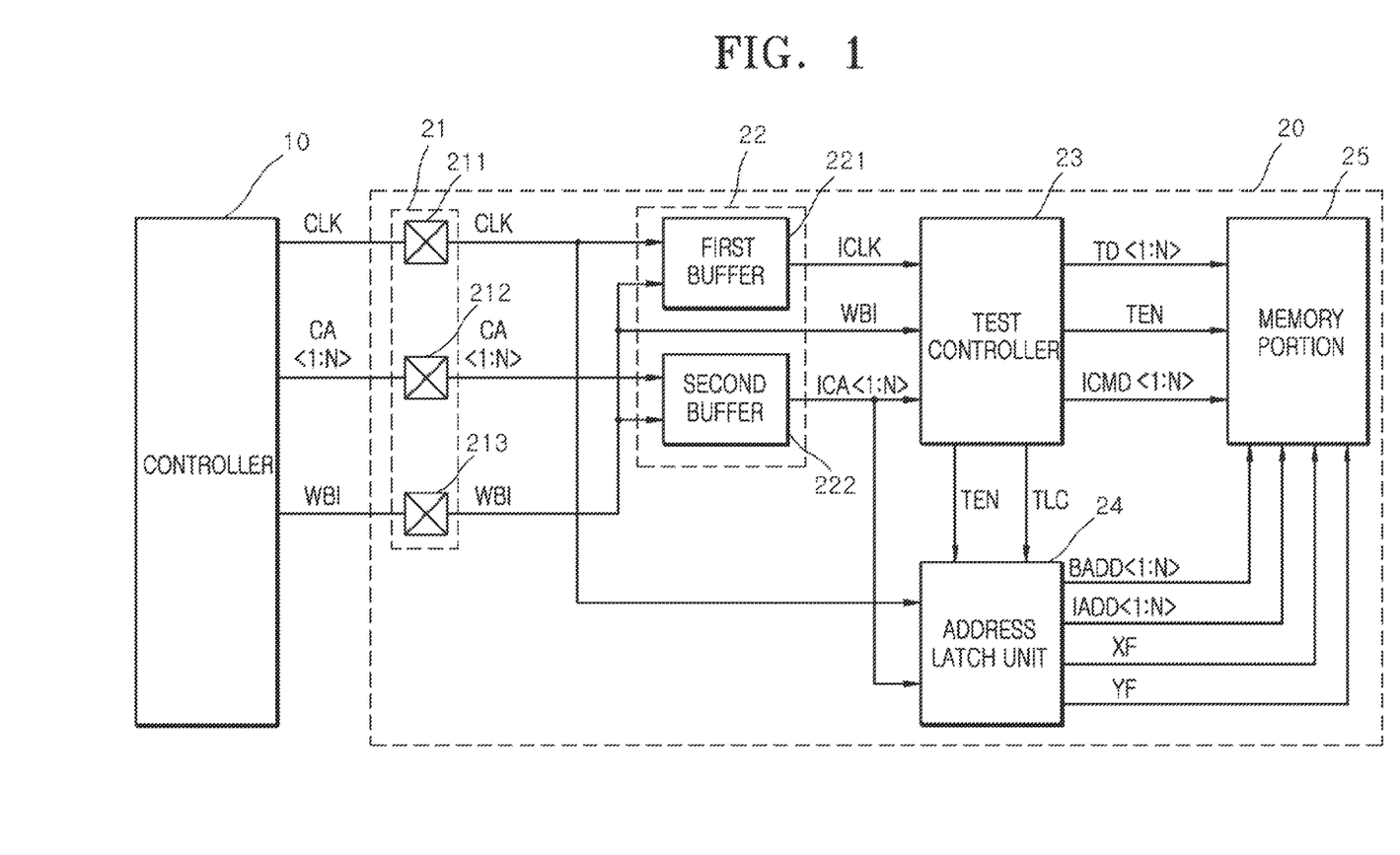
FIG. 1 is a block diagram illustrating a semiconductor system according to an embodiment of the invention.

Referring to FIG. 1, a semiconductor system according to an embodiment may include a controller 10 and a semiconductor device 20. The semiconductor device 20 may include a pad portion 21, a buffer portion 22, a test controller 23, an address latch unit 24 and a memory portion 25.

The controller 10 may output a burn-in test signal WBI, command/address signals CA<1:N> and a clock signal CLK. The command/address signals CA<1:N> may include commands and addresses. Although FIG. 1 illustrates that the command/address signals CA<1:N> are transmitted through a single line, N-number of bits included in the command/address signals CA<1:N> may be actually transmitted in parallel through N-number of lines respectively. The burn-in test signal WBI may be set to put the semiconductor device 20 in a first test mode for executing a burn-in test using only a specific pad without using all of pads of the semiconductor device 20.

More specifically, the first test mode may correspond to a test mode that only the specific pad is under the burn-in test and the remaining pads are under a normal test.

The pad portion 21 may include a plurality of pads 211, 212 and 213 that receive and transmit the burn-in test signal WBI, the command/address signals CA<1:N> and the clock signal CLK. The pad portion 21 may be realized to include general pads through which external signals are transmitted to internal circuits of the semiconductor device 20 or internal signals generated from the internal circuits of the semiconductor device 20 are outputted. The number of the pads may be set to be different according to the embodiments.

The buffer portion 22 may include a first buffer 221 and a second buffer 222.

The first buffer 221 may buffer the clock signal CLK to generate an internal clock signal ICLK according to the burn-in test signal WBI.

The second buffer 222 may buffer the command/address signals CA<1:N> to generate internal command/address signals ICA<1:N> in response to the burn-in test signal WBI.

The test controller 23 may generate a test enablement signal TEN and a test latch control signal TLC for activating a second test mode in response to the burn-in test signal WBI if the internal command/address signals ICA<1:N> synchronized with the internal clock signal ICLK have a first level combination. The test controller 23 may generate internal command signals ICMD<1:N> for activating a third test mode in response to the burn-in test signal WBI if the internal command/address signals ICA<1:N> synchronized with the internal clock signal ICLK have a second level combination. The test controller 23 may also generate test data TD<1:N> having a predetermined level combination. An operation for generating the test enablement signal TEN, the test latch control signal TLC and the internal command signals ICMD<1:N> according to a level combination of the internal command/address signals ICA<1:N> will be described more fully later.

The second test mode may correspond to a test mode that a normal test is executed during the burn-in test. In addition, the second test mode may correspond to a built in self stress (BISS) test that a specific word line is repeatedly selected to repeatedly apply a stress to memory cells electrically coupled to the selected word line. The third test mode may correspond to a test mode that an active operation, a write operation, a read operation and a pre-charge operation are executed in the semiconductor device 20 during the burn-in test.

The address latch unit 24 may latch the internal command/address signals ICA<1:N> synchronized with the clock signal CLK to generate bank address signals BADD<1:N> and internal address signals IADD<1:N>, in response to the test enablement signal TEN and the test latch control signal TLC. Moreover, the address latch unit 24 may generate a row fix signal XF and a column fix signal YF from the internal command/address signals ICA<1:N> synchronized with the clock signal CLK, in response to the test enablement signal TEN and the test latch control signal TLC. The row fix signal XF and the column fix signal YF may be generated to include specific bits among bits of the internal command/address signals ICA<1:N> in the third test mode.

The memory portion 25 may store or output the test data TD<1:N> according to the internal command signals ICMD<1:N> in response to the test enablement signal TEN. More specifically, the memory portion 25 may execute an active operation, a write operation, a read operation and a pre-charge operation according to the internal command signals ICMD<1:N> to receive or output the test data TD<1:N>. The memory portion 25 may invert the test data TD<1:N> to store the inverted data of the test data TD<1:N> therein or may directly store the test data TD<1:N> therein without inversion of the test data TD<1:N>. The operations executed in the memory portion 25 will be described more fully later.

Figure 2:
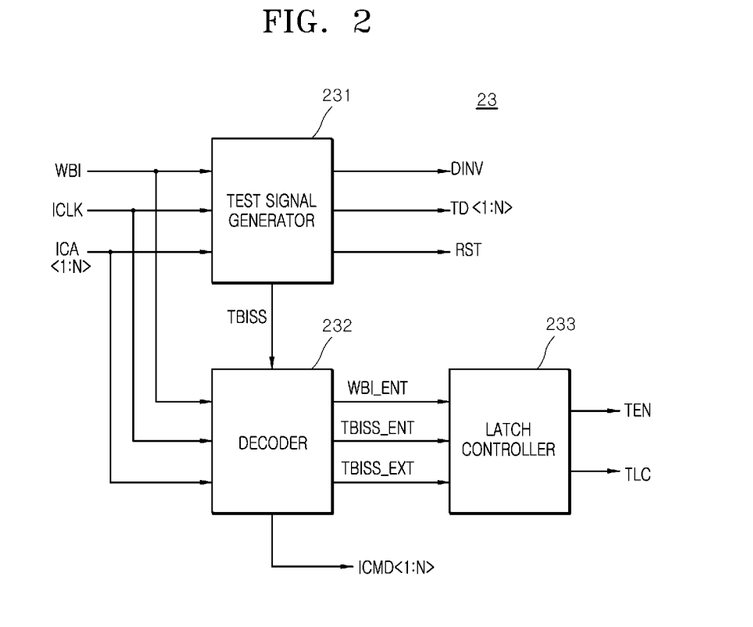
FIG. 2 is a block diagram illustrating a test controller included in a semiconductor device of the semiconductor system of FIG. 1.

Referring to FIG. 2, the test controller 23 may include a test signal generator 231, a decoder 232 and a latch controller 233.

The test signal generator 231 may generate a test start signal TBISS enabled, a data control signal DINV, and the test data TD<1:N> having a predetermined level combination in response to the burn-in test signal WBI if the internal command/address signals ICA<1:N> synchronized with the internal clock signal ICLK have a first level combination. Further, the test signal generator 231 may generate a reset signal RST enabled if the first test mode is activated by the burn-in test signal WBI or if the second or third test mode is activated according to a level combination of the internal command/address signals ICA<1:N>. The data control signal DINV may be generated to include specific bits among bits of the internal command/address signals ICA<1:N> to store the test data TD<1:N> or inverted data of the test data TD<1:N> in the memory portion 25. The test data TD<1:N> may also be generated to include specific bits among bits of the internal command/address signals ICA<1:N> according to the embodiments and may be stored in the test signal generator 231 to have a predetermined level combination.

The decoder 232 may generate a first entrance signal WBI_ENT enabled in response to the burn-in test signal WBI; a second entrance signal TBISS_ENT and a termination signal TBISS_EXT according to a level combination of the internal command/address signals ICA<1:N> in response to the test start signal TBISS; and the internal command signals ICMD<1:N> according to a level combination of the internal command/address signals ICA<1:N>. An operation for generating the second entrance signal TBISS_ENT and a termination signal TBISS_EXT will be described more fully with reference to the figures later.

The latch controller 233 may generate the test enablement signal TEN and the test latch control signal TLC enabled from a point of time that the second entrance signal TBISS_ENT is enabled till a point of time that the termination signal TBISS_EXT is enabled.

Figure 3:
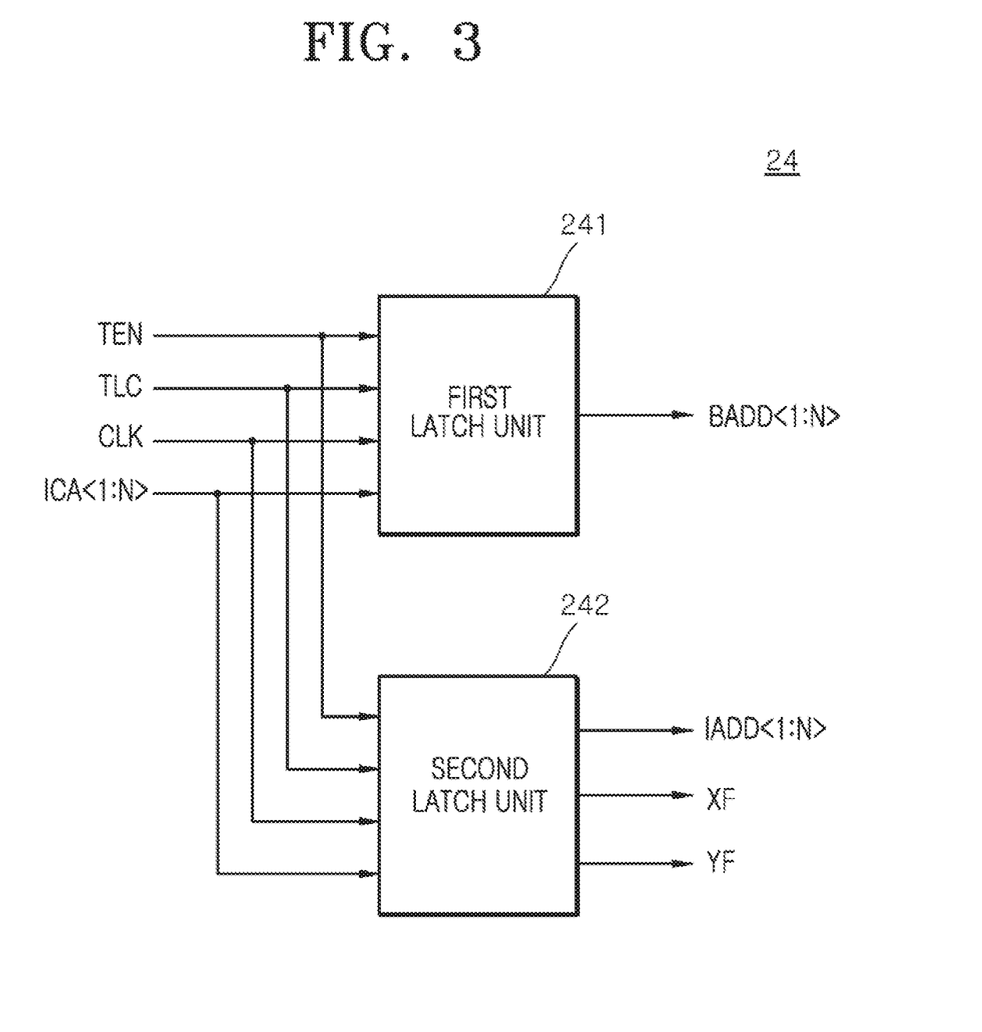
FIG. 3 is a block diagram illustrating an address latch unit included in a semiconductor device of the semiconductor system of FIG. 1.

Referring to FIG. 3, the address latch unit 24 may include a first latch unit 241 and a second latch unit 242.

The first latch unit 241 may latch the internal command/address signals ICA<1:N> to generate the bank address signals BADD<1:N> in response to the test enablement signal TEN and the test latch control signal TLC.

The second latch unit 242 may latch the internal command/address signals ICA<1:N> to generate the internal address signals IADD<1:N> and may generate in response to the test enablement signal TEN and the test latch control signal TLC and may generate the row fix signal XF and the column fix signal YF from the internal command/address signals ICA<1:N> in response to the test enablement signal TEN and the test latch control signal TLC. The row fix signal XF and the column fix signal YF may be generated to include specific bits among bits of the internal command/address signals ICA<1:N>.

Figure 4:
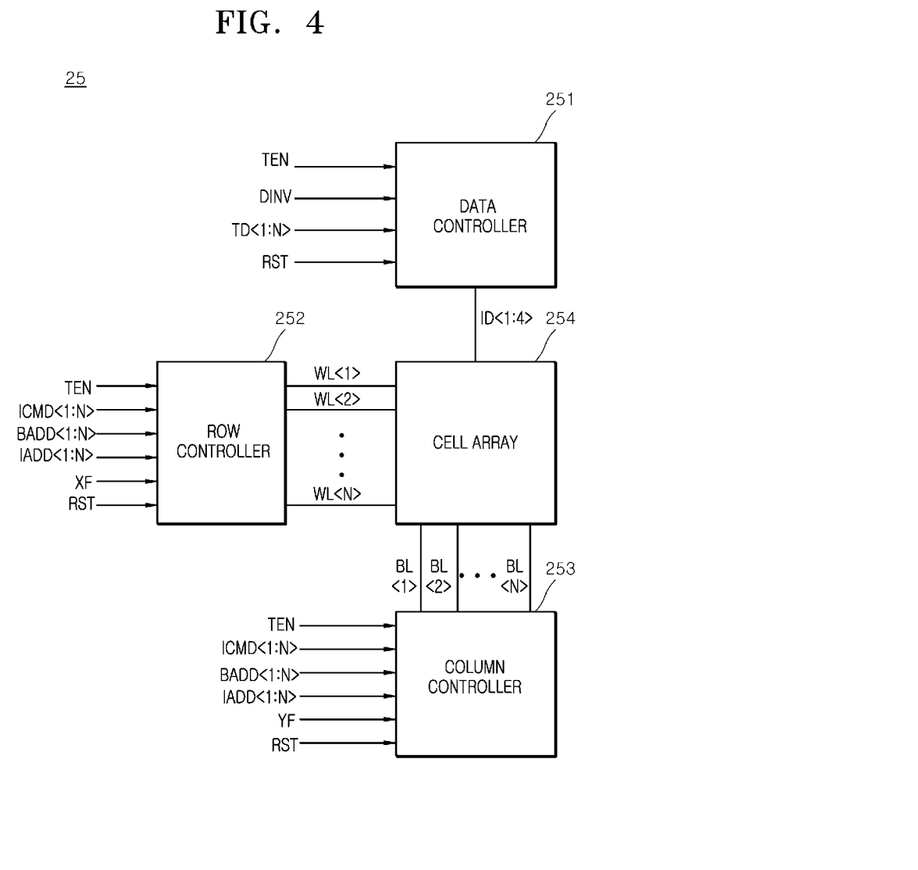
FIG. 4 is a block diagram illustrating a memory portion included in a semiconductor device of the semiconductor system of FIG. 1.

Referring to FIG. 4, the memory portion 25 may include a data controller 251, a row controller 252, a column controller 253 and a cell array 254.

The data controller 251 may be initialized in response to the reset signal RST. The data controller 251 may invert or non-invert the test data TD<1:N> according to a level of the data control signal DINV. The data controller 251 may output the test data TD<1:N> or the inverted data of the test data TD<1:N> as internal data ID<1:N> in response to the test enablement signal TEN.

The row controller 252 may be initialized in response to the reset signal RST. The row controller 252 may execute an active operation, a write operation, a read operation and a pre-charge operation in response to the test enablement signal TEN and the internal command signals ICMD<1:N>. The row controller 252 may select one of a plurality of word lines WL<1:N> according to a level combination of the bank address signals BADD<1:N> and the internal address signals IADD<1:N>. In addition, the row controller 252 may sequentially select the plurality of word lines WL<1:N> if the test enablement signal TEN is disabled and may repeatedly select at least one of the plurality of word lines WL<1:N> in response to the row fix signal XF.

The column controller 253 may be initialized in response to the reset signal RST. The column controller 253 may execute an active operation, a write operation, a read operation and a pre-charge operation in response to the test enablement signal TEN and the internal command signals ICMD<1:N>. The column controller 253 may select at least one of a plurality of bit lines BL<1:N> according to a level combination of the bank address signals BADD<1:N> and the internal address signals IADD<1:N>. In addition, the column controller 253 may sequentially select the plurality of bit lines BL<1:N> if the test enablement signal TEN is disabled and may repeatedly select at least one of the plurality of bit lines BL<1:N> in response to the column fix signal YF.

The cell array 254 may include a plurality of memory cells located at cross points of the plurality of word lines WL<1:N> and the plurality of bit lines BL<1:N>. The internal data ID<1:N> may be stored in the memory cells located at cross points of the selected word line and the selected bit lines. On the contrary, the cell array 254 may output the data stored in the memory cells located at cross points of the selected word line and the selected bit lines as the internal data ID<1:N>.

Figure 5:
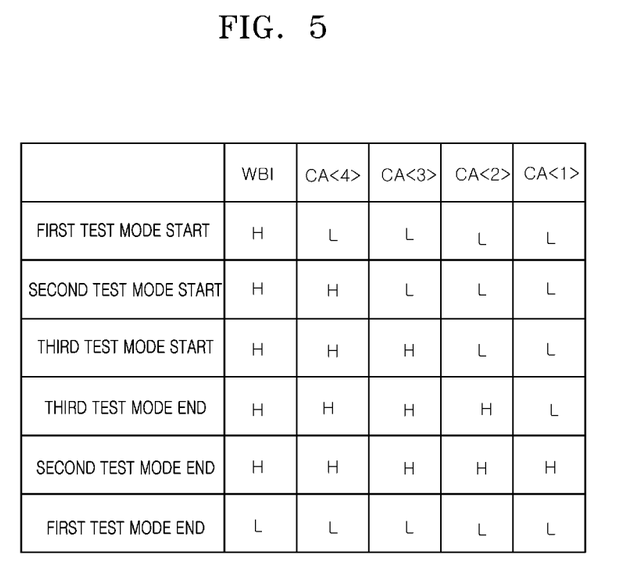
FIG. 5 is a table illustrating an operation of the semiconductor system shown in FIG. 1.

Referring to FIG. 5, an operation of the semiconductor system that executes various test modes according to a level combination of the burn-in test signal WBI and the command/address signals CA<1:N> is illustrated.

First, the semiconductor device 20 may enter the first test mode if the burn-in test signal WBI has a logic "high(H)" level and the first to fourth command/address signals CA<1:4> have a level combination of 'L,L,L,L'. The level combination 'L,L,L,L' of the first to fourth command/address signals CA<1:4> means that all of the first to fourth command/address signals CA<1:4> have a logic "low(L)".

Next, the semiconductor device 20 may enter the second test mode if the burn-in test signal WBI has a logic "H" level and the first to fourth command/address signals CA<1:4> have a level combination of 'H,L,L,L'. The level combination 'H,L,L,L' of the first to fourth command/address signals CA<1:4> means that the first command/address signal CA<1> has a logic "L" level; the second command/address signal CA<2> has a logic "L" level; the third command/address signal CA<3> has a logic "L" level; and the fourth command/address signal CA<4> has a logic "H" level.

Next, the semiconductor device 20 may enter the third test mode if the burn-in test signal WBI has a logic "H" level and the first to fourth command/address signals CA<1:4> have a level combination of 'H,H,L,L'. The level combination 'H,H,L,L' of the first to fourth command/address signals CA<1:4> means that the first command/address signal CA<1> has a logic "L" level; the second command/address signal CA<2> has a logic "L" level; the third command/address signal CA<3> has a logic "H" level; and the fourth command/address signal CA<4> has a logic "H" level.

Next, the semiconductor device 20 may terminate the third test mode if the burn-in test signal WBI has a logic "H" level and the first to fourth command/address signals CA<1:4> have a level combination of 'H,H,H,L'. The level combination 'H,H,H,L' of the first to fourth command/address signals CA<1:4> means that the first command/address signal CA<1> has a logic "L" level; the second command/address signal CA<2> has a logic "H" level; the third command/address signal CA<3> has a logic "H" level; and the fourth command/address signal CA<4> has a logic "H" level.

Next, the semiconductor device 20 may terminate the second test mode if the burn-in test signal WBI has a logic "H" level and the first to fourth command/address signals CA<1:4> have a level combination of 'H,H,H,H'. The level combination 'H,H,H,H' of the first to fourth command/address signals CA<1:4> means that the first command/address signal CA<1> has a logic "H" level; the second command/address signal CA<2> has a logic "H" level; the third command/address signal CA<3> has a logic "H" level; and the fourth command/address signal CA<4> has a logic "H" level.

Next, the semiconductor device 20 may terminate the first test mode if the burn-in test signal WBI has a logic "L" level and the first to fourth command/address signals CA<1:4> have a level combination of 'L,L,L,L'. The level combination 'L,L,L,L' of the first to fourth command/address signals CA<1:4> means that the first command/address signal CA<1> has a logic "L" level; the second command/address signal CA<2> has a logic "L" level; the third command/address signal CA<3> has a logic "L" level; and the fourth command/address signal CA<4> has a logic "L" level.

An operation of the semiconductor system according to an embodiment will be described hereinafter with reference to FIG. 6 in conjunction with an example in which the second and third test modes are executed according to a level combination of the first to fourth command/address signals CA<1:4> during the first test mode.

A step S1 of entering the first test mode may be achieved when the controller 10 outputs the burn-in test signal WBI having a logic "H" level and the first to fourth command/address signals CA<1:4> having a level combination of 'L,L,L,L'. In such a case, the semiconductor device 20 may receive the burn-in test signal WBI having a logic "H" level to enter the first test mode.

Figure 6:
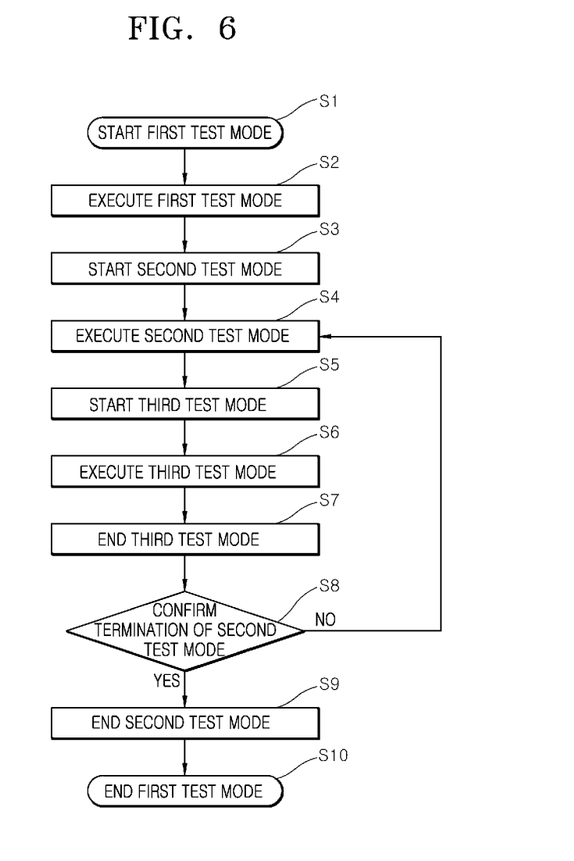
FIG. 6 is a flowchart illustrating an operation of a semiconductor system according to an embodiment of the invention.

After the semiconductor device 20 enters the first test mode, the semiconductor device 20 may execute the first test mode according to the clock signal CLK and the first to fourth command/address signals CA<1:4> (see a step S2 of FIG. 6).

While the semiconductor device 20 executes the first test mode, the controller 10 may output the burn-in test signal WBI having a logic "H" level and the first to fourth command/address signals CA<1:4> having a level combination of 'H,L,L,L'. In such a case, the semiconductor device 20 may receive the burn-in test signal WBI having a logic "H" level and the first to fourth command/address signals CA<1:4> having a level combination of 'H,L,L,L' to enter the second test mode (see a step S3 of FIG. 6).

After the semiconductor device 20 enters the second test mode, the semiconductor device 20 may execute the second test mode according to the clock signal CLK and the first to fourth command/address signals CA<1:4> (see a step S4 of FIG. 6).

While the semiconductor device 20 executes the second test mode, the controller 10 may output the burn-in test signal WBI having a logic "H" level and the first to fourth command/address signals CA<1:4> having a level combination of 'H,H,L,L'. In such a case, the semiconductor device 20 may receive the burn-in test signal WBI having a logic "H" level and the first to fourth command/address signals CA<1:4> having a level combination of 'H,H,L,L' to enter the third test mode (see a step S5 of FIG. 6).

After the semiconductor device 20 enters the third test mode, the semiconductor device 20 may execute the third test mode according to the clock signal CLK and the first to fourth command/address signals CA<1:4> (see a step S6 of FIG. 6).

While the semiconductor device 20 executes the third test mode, the controller 10 may output the burn-in test signal WBI having a logic "H" level and the first to fourth command/address signals CA<1:4> having a level combination of 'H,H,H,L'. In such an instance, the semiconductor device 20 may receive the burn-in test signal WBI having a logic "H" level and the first to fourth command/address signals CA<1:4> having a level combination of 'H,H,H,L' to terminate the third test mode (see a step S7 of FIG. 6).

After the third test mode terminates, the termination or the continuation of the second test mode may be determined (see a step S8 of FIG. 6). If the second test mode has to be continuously executed, the semiconductor device 20 may execute the step S4 again.

If the second test mode has to be terminated, the controller 10 may output the burn-in test signal WBI having a logic "H" level and the first to fourth command/address signals CA<1:4> having a level combination of 'H,H,H,H'. In such an instance, the semiconductor device 20 may receive the burn-in test signal WBI having a logic "H" level and the first to fourth command/address signals CA<1:4> having a level combination of 'H,H,H,H' to terminate the second test mode (see a step S9 of FIG. 6).

After the second test mode terminates, the controller 10 may output the burn-in test signal WBI having a logic "L" level and the first to fourth command/address signals CA<1:4> having a level combination of 'L,L,L,L'. In such a case, the semiconductor device 20 may receive the burn-in test signal WBI having a logic "L" level and the first to fourth command/address signals CA<1:4> having a level combination of 'L,L,L,L' to terminate the first test mode (see a step S10 of FIG. 6).

Operations executed in the first, second and third test modes will be separately described more fully hereinafter with reference to FIGS. 1 to 6.

First, an operation executed in the first test mode is as follows.

The controller 10 may output the clock signal CLK, the burn-in test signal WBI having a logic "H" level, and the first to fourth command/address signals CA<1:4> having a level combination of 'L,L,L,L'.

The buffer portion 22 may buffer the clock signal CLK and the first to fourth command/address signals CA<1:4> inputted through the pad portion 21 to generate the internal clock signal ICLK and the first to fourth internal command/address signals ICA<1:4>.

The test signal generator 231 of the test controller 23 may generate the data control signal DINV and the test data TD<1:N> from the first to fourth internal command/address signals ICA<1:4> in response to the burn-in test signal WBI having a logic "H" level.

The decoder 232 may receive the burn-in test signal WBI having a logic "H" level to generate the first entrance signal WBI_ENT enabled without generation of the internal command signals ICMD<1:N>.

The latch controller 233 may receive the first entrance signal WBI_ENT not to generate the test enablement signal TEN and the test latch control signal TLC.

The first latch unit 241 of the address latch unit 24 may latch internal the first to fourth command/address signals ICA<1:4> synchronized with the clock signal CLK to generate the first to fourth bank address signals BADD<1:4>.

The second latch unit 242 may latch the first to fourth internal command/address signals ICA<1:4> synchronized with the clock signal CLK to generate the first to fourth internal address signals IADD<1:4>. In such a case, the second latch unit 242 does not generate the row fix signal XF and the column fix signal YF. The first to fourth internal address signals IADD<1:4> outputted from the second latch unit 242 may be generated by latching the first to fourth internal command/address signals ICA<1:4> that are the same as the first to fourth internal command/address signals ICA<1:4> inputted to the first latch unit 241.

The data controller 251 of the memory portion 25 may invert or non-invert the test data TD<1:N> according to a level of the data control signal DINV and may output the test data TD<1:N> or the inverted data of the test data TD<1:N> as the internal data ID<1:N>.

The row controller 252 may sequentially and repeatedly select the plurality of word lines WL<1:N> because the test enablement signal TEN has a disabled state.

The column controller 253 may sequentially and repeatedly select the plurality of bit lines BL<1:N> because the test enablement signal TEN has a disabled state.

The cell array 254 may input the internal data ID<1:N> in the memory cells located at cross points of the selected word line and the selected bit lines and may output the internal data ID<1:N> stored in the selected memory cells.

In the first test mode, the semiconductor device 20 may receive the first to fourth command/address signals CA<1:4> among the command/address signals CA<1:N> through specific pads and may execute the burn-in test that sequentially and repeatedly applies stress to the memory cells located at cross points of the word lines and the bit lines.

Next, an operation executed in the second test mode is as follows.

The controller 10 may output the clock signal CLK, the burn-in test signal WBI having a logic "H" level, and the first to fourth command/address signals CA<1:4> having a level combination of 'H,L,L,L'.

The buffer portion 22 may buffer the clock signal CLK and the first to fourth command/address signals CA<1:4> inputted through the pad portion 21 to generate the internal clock signal ICLK and the first to fourth internal command/address signals ICA<1:4>.

The test signal generator 231 of the test controller 23 may receive the burn-in test signal WBI having a logic "H" level and the first to fourth internal command/address signals ICA<1:4> having a first level combination to generate the test start signal TBISS and may generate the data control signal DINV and the test data TD<1:N> from the first to fourth internal command/address signals ICA<1:4>.

The decoder 232 may receive the first to fourth internal command/address signals ICA<1:4> to generate the second entrance signal TBISS_ENT without generation of the internal command signals ICMD<1:N>, in response to the burn-in test signal WBI having a logic "H" level and the test start signal TBISS.

The latch controller 233 may receive the second entrance signal TBISS_ENT to generate the test enablement signal TEN and the test latch control signal TLC.

The first latch unit 241 of the address latch unit 24 may latch the first to fourth internal command/address signals ICA<1:4> synchronized with the clock signal CLK to generate the first to fourth bank address signals BADD<1:4> in response to the test enablement signal TEN and the test latch control signal TLC.

The second latch unit 242 may latch the first to fourth internal command/address signals ICA<1:4> synchronized with the clock signal CLK to generate the first to fourth internal address signals IADD<1:4> in response to the test enablement signal TEN and the test latch control signal TLC. The first to fourth internal address signals IADD<1:4> outputted from the second latch unit 242 may be generated from the first to fourth internal command/address signals ICA<1:4> re-inputted to the second latch unit 242 in synchronization with the clock signal CLK after the first to fourth internal command/address signals ICA<1:4> latched by the first latch unit 241 are inputted to the second latch unit 242. In such an instance, the second latch unit 242 may generate the row fix signal XF and the column fix signal YF from specific bits of the first to fourth internal command/address signals ICA<1:4>.

The data controller 251 of the memory portion 25 may invert or non-invert the test data TD<1:N> according to a level of the data control signal DINV and may output the test data TD<1:N> or the inverted data of the test data TD<1:N> as the internal data ID<1:N>.

The row controller 252 may repeatedly select any one of the plurality of word lines WL<1:N> in response to the row fix signal XF, the first to fourth bank address signals BADD<1:4>, and the first to fourth internal address signals IADD<1:4>.

The column controller 253 may repeatedly select at least one of the plurality of bit lines BL<1:N> in response to the column fix signal YF, the first to fourth bank address signals BADD<1:4>, and the first to fourth internal address signals IADD<1:4>.

The cell array 254 may input the internal data ID<1:N> in the memory cell located at a cross point of the selected word line and the selected bit line(s). Further, the cell array 254 may output the internal data ID<1:N> stored in the selected memory cell(s).

In the second test mode, the semiconductor device 20 may execute a normal test during the burn-in test or may execute a BISS test that a specific word line is repeatedly selected to repeatedly apply a stress to memory cells electrically coupled to the selected word line.

Next, an operation executed in the third test mode is as follows.

The controller 10 may output the clock signal CLK, the burn-in test signal WBI having a logic "H" level, and the first to fourth command/address signals CA<1:4> having a level combination of 'H,H,L,L'.

The buffer portion 22 may buffer the clock signal CLK and the first to fourth command/address signals CA<1:4> inputted through the pad portion 21 to generate the internal clock signal ICLK and the first to fourth internal command/address signals ICA<1:4>.

The test signal generator 231 of the test controller 23 may receive the burn-in test signal WBI having a logic "H" level and the first to fourth internal command/address signals ICA<1:4> having a second level combination to generate the test start signal TBISS and may generate the data control signal DINV and the test data TD<1:N> from the first to fourth internal command/address signals ICA<1:4>.

The decoder 232 may receive the first to fourth internal command/address signals ICA<1:4> to generate the termination signal TBISS_EXT in response to the burn-in test signal WBI having a logic "H" level and the test start signal TBISS and may generate the internal command signals ICMD<1:N> from the first to fourth internal command/address signals ICA<1:4>.

The latch controller 233 may receive the termination signal TBISS_EXT not to generate the test enablement signal TEN and the test latch control signal TLC.

The first latch unit 241 of the address latch unit 24 may latch the internal first to fourth command/address signals ICA<1:4> synchronized with the clock signal CLK to generate the first to fourth bank address signals BADD<1:4>.

The second latch unit 242 may latch the first to fourth internal command/address signals ICA<1:4> synchronized with the clock signal CLK to generate the first to fourth internal address signals IADD<1:4>. In such a case, the second latch unit 242 does not generate the row fix signal XF and the column fix signal YF. The first to fourth internal address signals IADD<1:4> outputted from the second latch unit 242 may be generated by latching the first to fourth internal command/address signals ICA<1:4> that are the same as the first to fourth internal command/address signals ICA<1:4> inputted to the first latch unit 241.

The data controller 251 of the memory portion 25 may invert or non-invert the test data TD<1:N> according to a level of the data control signal DINV and may output the test data TD<1:N> or the inverted data of the test data TD<1:N> as the internal data ID<1:N>.

The row controller 252 may receive the first to fourth bank address signals BADD<1:4> and the first to fourth internal address signals IADD<1:4> to select any one of the plurality of word lines WL<1:N> for execution of an active operation, a write operation, a read operation or a pre-charge operation according to the internal command signals ICMD<1:N>.

The column controller 253 may receive the first to fourth bank address signals BADD<1:4> and the first to fourth internal address signals IADD<1:4> to select at least one of the plurality of bit lines BL<1:N> for execution of an active operation, a write operation, a read operation or a pre-charge operation according to the internal command signals ICMD<1:N>.

The cell array 254 may input the internal data ID<1:N> in the memory cell located at a cross point of the selected word line and the selected bit line(s). Further, the cell array 254 may output the internal data ID<1:N> stored in the selected memory cell(s).

In the third test mode, the semiconductor device 20 may execute an active operation, a write operation, a read operation or a pre-charge operation during the burn-in test.

As described above, a semiconductor system according to an embodiment may execute various test modes according to a level combination of command/address signals while a burn-in test is performed.

What is claimed is:

1. A semiconductor system comprising:
 a controller suitable for outputting a burn-in test signal, a clock signal and command/address signals; and
 a semiconductor device suitable for entering a first test mode if the burn-in test signal is inputted, suitable for entering a second test mode according to a level combination of the command/address signals in synchronization with the clock signal after the semiconductor device enters the first test mode, and suitable for entering a third test mode according to an other level combination of the command/address signals in synchronization with the clock signal after the semiconductor device enters the second test mode, wherein the second test mode corresponds to a self-stress test wherein a specific word line is repeatedly selected to repeatedly apply a stress to memory cells electrically coupled to the selected word line,
 wherein the semiconductor device includes:
 a buffer portion suitable for buffering the clock signal to generate an internal clock signal in response to the burn-in test signal and suitable for buffering the command/address signals to generate internal command/address signals in response to the burn-in test signal;
 a test controller suitable for generating a test enablement signal and a test latch control signal for activating the second test mode in response to the burn-in test signal if the internal command/address signals synchronized with the internal clock signal have a first level combination, suitable for generating internal command signals for activating the third test mode in response to the burn-in test signal if the internal command/address signals synchronized with the internal clock signal have a second level combination, and suitable for generating test data having a predetermined level combination;
 an address latch unit suitable for latching the internal command/address signals synchronized with the clock signal to generate bank address signals and internal address signals in response to the test enablement signal and the test latch control signal and suitable for generating a row fix signal or a column fix signal from the command/address signals; and
 a memory portion suitable for storing the test data or outputting the test data stored according to the internal command signals in response to the test enablement signal, wherein the row fix signal is a signal for repeatedly selecting at least one of a plurality of word lines and the column fix signal is a signal for repeatedly selecting at least one of a plurality of bit lines.

2. The semiconductor system of claim 1,
 wherein the first test mode is executed while the burn-in test signal is enabled;
 wherein the second test mode is executed in a period that the first test mode is executed; and
 wherein the third test mode is executed in an other period that the second test mode is executed.

3. The semiconductor system of claim 1, wherein the buffer portion includes:
 a first buffer suitable for buffering the clock signal to generate the internal clock signal in response to the burn-in test signal; and
 a second buffer suitable for buffering the command/address signals to generate the internal command/address signals in response to the burn-in test signal.

4. The semiconductor system of claim 1, wherein the test controller includes:
 a test signal generator suitable for generating a test start signal, a data control signal, the test data and a reset signal according to a first level combination of the internal command/address signals synchronized with the internal clock signal in response to the burn-in test signal;
 a decoder suitable for generating a first entrance signal which is enabled in response to the burn-in test signal, suitable for generating a second entrance signal and a termination signal according to a second level combination of the internal command/address signals in response to the test start signal, and suitable for generating the internal command signals according to a third level combination of the internal command/address signals; and
 a latch controller suitable for generating the test enablement signal and the test latch control signal which are enabled from a point of time that the second entrance signal is enabled till an other point of time that the termination signal is enabled.

5. The semiconductor system of claim 1, wherein the address latch unit includes:
 a first latch unit suitable for latching the internal command/address signals synchronized with the clock signal to generate the bank address signals in response to the test enablement signal and the test latch control signal; and
 a second latch unit suitable for latching the internal command/address signals synchronized with the clock signal to generate the internal address signals in response to the test enablement signal and the test latch control signal and suitable for generating the row fix signal and the column fix signal from the command/address signals.

6. The semiconductor system of claim 1, wherein the memory portion includes:
 a data controller suitable for inverting or non-inverting the test data according to a level of the data control signal to output the test data or the inverted data of the test data as internal data in response to the test enablement signal;
 a row controller suitable for being driven in response to the test enablement signal and the internal command signals, suitable for selecting one of a plurality of word lines according to a level combination of the bank address signals and the internal address signals, and suitable for sequentially selecting the plurality of word lines if the test enablement signal is disabled;
 a column controller suitable for being driven in response to the test enablement signal and the internal command signals, suitable for selecting one of a plurality of bit lines according to an other level combination of the bank address signals and the internal address signals, and suitable for sequentially selecting the plurality of bit lines if the test enablement signal is disabled; and
 a cell array including a plurality of memory cells which are located at cross points of the plurality of word lines and the plurality of bit lines,
 wherein the internal data are stored in the memory cells which are located at cross points of the selected word line and the selected bit line.

7. The semiconductor system of claim 6,
wherein the row controller repeatedly selects the one of the plurality of word lines in response to the row fix signal; and
wherein the column controller repeatedly selects the one of the plurality of bit lines in response to the column fix signal.

8. A semiconductor device comprising:
a buffer portion suitable for buffering a clock signal to generate an internal clock signal according to a burn-in test signal for activating a first test mode and suitable for buffering command/address signals to generate internal command/address signals according to the burn-in test signal;
a test controller suitable for generating a test enablement signal and a test latch control signal for activating a second test mode according to the burn-in test signal if the internal command/address signals synchronized with the internal clock signal have a first level combination, suitable for generating internal command signals for activating a third test mode according to the burn-in test signal if the internal command/address signals have a second level combination, and suitable for generating test data having a predetermined level combination; and
a memory portion suitable for storing the test data therein or outputting the test data stored according to the internal command signals according to the test enablement signal, wherein the second test mode corresponds to a self-stress test wherein a specific word line is repeatedly selected to repeatedly apply a stress to memory cells electrically coupled to the selected word line,
wherein the test controller includes:
a test signal generator suitable for generating a test start signal, a data control signal, the test data and a reset signal according to a level combination of the internal command/address signals synchronized with the internal clock signal in response to the burn-in test signal;
a decoder suitable for generating a first entrance signal which is enabled in response to the burn-in test signal, suitable for generating a second entrance signal and a termination signal according to a level combination of the internal command/address signals in response to the test start signal, and suitable for generating the internal command signals according to a level combination of the internal command/address signals; and
a latch controller suitable for generating the test enablement signal and the test latch control signal which are enabled from a point of time that the second entrance signal is enabled till an other point of time that the termination signal is enabled.

9. The semiconductor device of claim 8,
wherein the first test mode is executed while the burn-in test signal is enabled;
wherein the second test mode is executed in a period that the first test mode is executed; and
wherein the third test mode is executed in an other period that the second test mode is executed.

10. The semiconductor device of claim 8, wherein the buffer portion includes:
a first buffer suitable for buffering the clock signal to generate the internal clock signal in response to the burn-in test signal; and
a second buffer suitable for buffering the command/address signals to generate the internal command/address signals in response to the burn-in test signal.

11. The semiconductor device of claim 8, wherein the memory portion includes:
a data controller suitable for inverting or non-inverting the test data according to a level of the data control signal to output the test data or the inverted data of the test data as internal data in response to the test enablement signal;
a row controller suitable for being driven in response to the test enablement signal and the internal command signals, suitable for selecting one of a plurality of word lines according to a level combination of bank address signals and internal address signals, and suitable for sequentially selecting the plurality of word lines if the test enablement signal is disabled;
a column controller suitable for being driven in response to the test enablement signal and the internal command signals, suitable for selecting one of a plurality of bit lines according to the level combination of the bank address signals and the internal address signals, and suitable for sequentially selecting the plurality of bit lines if the test enablement signal is disabled; and
a cell array including a plurality of memory cells which are located at cross points of the plurality of word lines and the plurality of bit lines,
wherein the internal data are stored in the memory cells which are located at cross points of the selected word line and the selected bit line.

12. The semiconductor device of claim 11,
wherein the row controller repeatedly selects the one of the plurality of word lines in response to a row fix signal; and
wherein the column controller repeatedly selects the one of the plurality of bit lines in response to a column fix signal,
wherein the row fix signal is a signal for repeatedly selecting at least one of the plurality of word lines and the column fix signal is a signal for repeatedly selecting at least one of the plurality of bit lines.

13. The semiconductor device of claim 8, further comprising:
a pad portion suitable for transmitting the burn-in test signal, the clock signal and the command/address signals from an external device to the buffer portion, the pad portion including a plurality pads; and
an address latch unit suitable for latching the command/address signals synchronized with the clock signal to generate bank address signals and internal address signals in response to the test enablement signal and the test latch control signal and suitable for generating a row fix signal and a column fix signal from the command/address signals,
wherein the row fix signal is a signal for repeatedly selecting at least one of the plurality of word lines and the column fix signal is a signal for repeatedly selecting at least one of the plurality of bit lines.

14. The semiconductor device of claim 9, wherein the burn-in test signal is configured to execute a burn-in test by using a specific pad.

15. The semiconductor device of claim 14, wherein only the specific pad is used in the burn-in test and remaining pads are used in a normal test.

16. The semiconductor device of claim 9, wherein the third test mode corresponds to a mode in which an active operation, a write operation, a read operation, and pre-charge operation are executed.

17. The semiconductor device of claim 9, wherein the first test mode is executed according to the burn-in test signal and first to fourth command/address signals.

18. The semiconductor device of claim 9, wherein the second test mode is executed according to the burn-in test signal and first to fourth command/address signals.

19. The semiconductor device of claim 9, wherein the third test mode is executed according to the burn-in test signal and first to fourth command/address signals.

20. The semiconductor device of claim 9, wherein the first test mode is terminated according to first to fourth command/address signals when the burn-in test signal disabled.

\* \* \* \* \*